(12) United States Patent
Lee et al.

(10) Patent No.: US 7,170,156 B2
(45) Date of Patent: Jan. 30, 2007

(54) LAMINAR MULTI-LAYER PIEZOELECTRIC ROLL COMPONENT

(75) Inventors: Chao-Ping Lee, Kaohsiung (TW); Chen-Yi Huang, Kaohsiung (TW); Teng-Ko Lin, Kaohsiung (TW)

(73) Assignee: Sunnytec Electronics Co., Ltd., Kaohsiung (TW)

( * ) Notice: Subject to any disclaimer, the term of this patent is extended or adjusted under 35 U.S.C. 154(b) by 0 days.

(21) Appl. No.: 11/099,349

(22) Filed: Apr. 4, 2005

(65) Prior Publication Data

US 2006/0220476 A1    Oct. 5, 2006

(51) Int. Cl.
*H01L 23/06* (2006.01)

(52) U.S. Cl. .................. 257/684; 257/510; 257/415; 438/438; 438/660; 438/663

(58) Field of Classification Search .............. None
See application file for complete search history.

(56) References Cited

U.S. PATENT DOCUMENTS 5,153,859 A * 10/1992 Chatigny et al. ........... 367/140

2001/0015597 A1 * 8/2001 Matsui et al. ............... 310/369

* cited by examiner

*Primary Examiner*—Brook Kebede
*Assistant Examiner*—Su C. Kim
(74) *Attorney, Agent, or Firm*—Christensen O'Connor Johnson Kindness PLLC (57) ABSTRACT

A multi-layer piezoelectric component includes a plurality of piezoelectric layers, a first inner electrode sheet, a second inner electrode sheet, a first outer electrode, and a second outer electrode. The piezoelectric layers are wound around an axis to form a laminar roll having first and second end faces transverse to the axis. The piezoelectric layers include at least one first layer and at least one second layer. Each of the first and second layers has opposite first and second edges respectively at the first and second end faces, and opposite inner and outer circumferential surfaces. The first and second inner electrode sheets respectively overlie the inner circumferential surfaces of the first and second layers. The first and second outer electrodes are respectively and electrically connected to the first and second inner electrode sheets.

12 Claims, 12 Drawing Sheets

LAMINAR MULTI-LAYER PIEZOELECTRIC ROLL COMPONENT

BACKGROUND OF THE INVENTION

1. Field of the Invention

The invention relates to a multi-layer piezoelectric component, more particularly to a multi-layer piezoelectric component having a laminar roll formed by winding a plurality of piezoelectric layers.

2. Description of the Related Art

Figure 1:
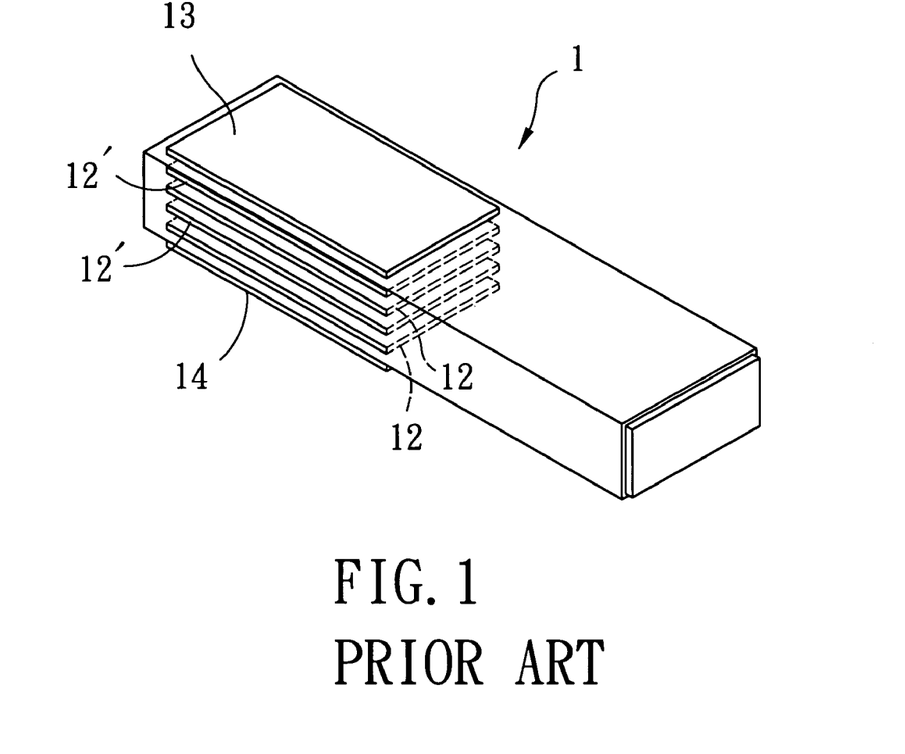
FIG. 1 is a perspective view of a conventional laminar piezoelectric component.
Figure 2:
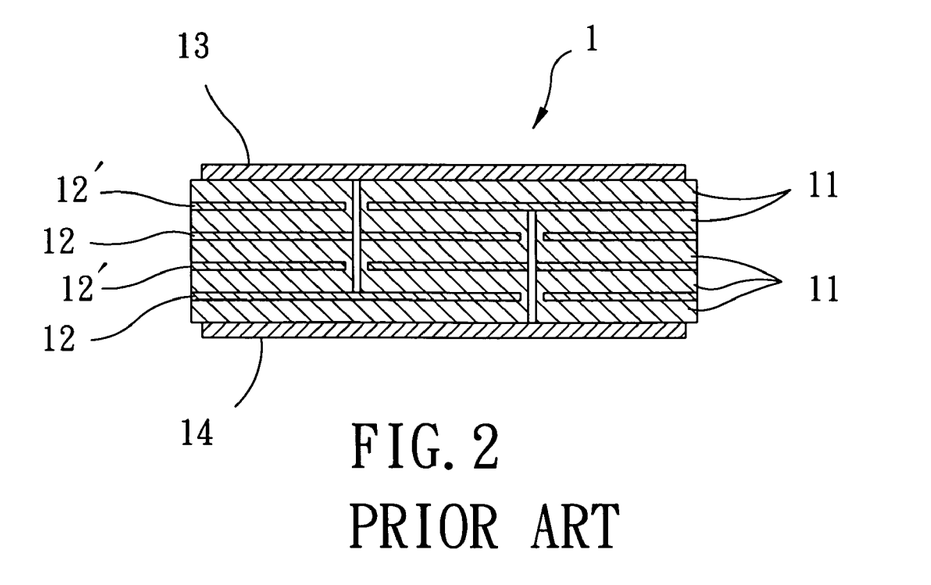
FIG. 2 is a sectional view of the conventional laminar piezoelectric component.
Figure 3:
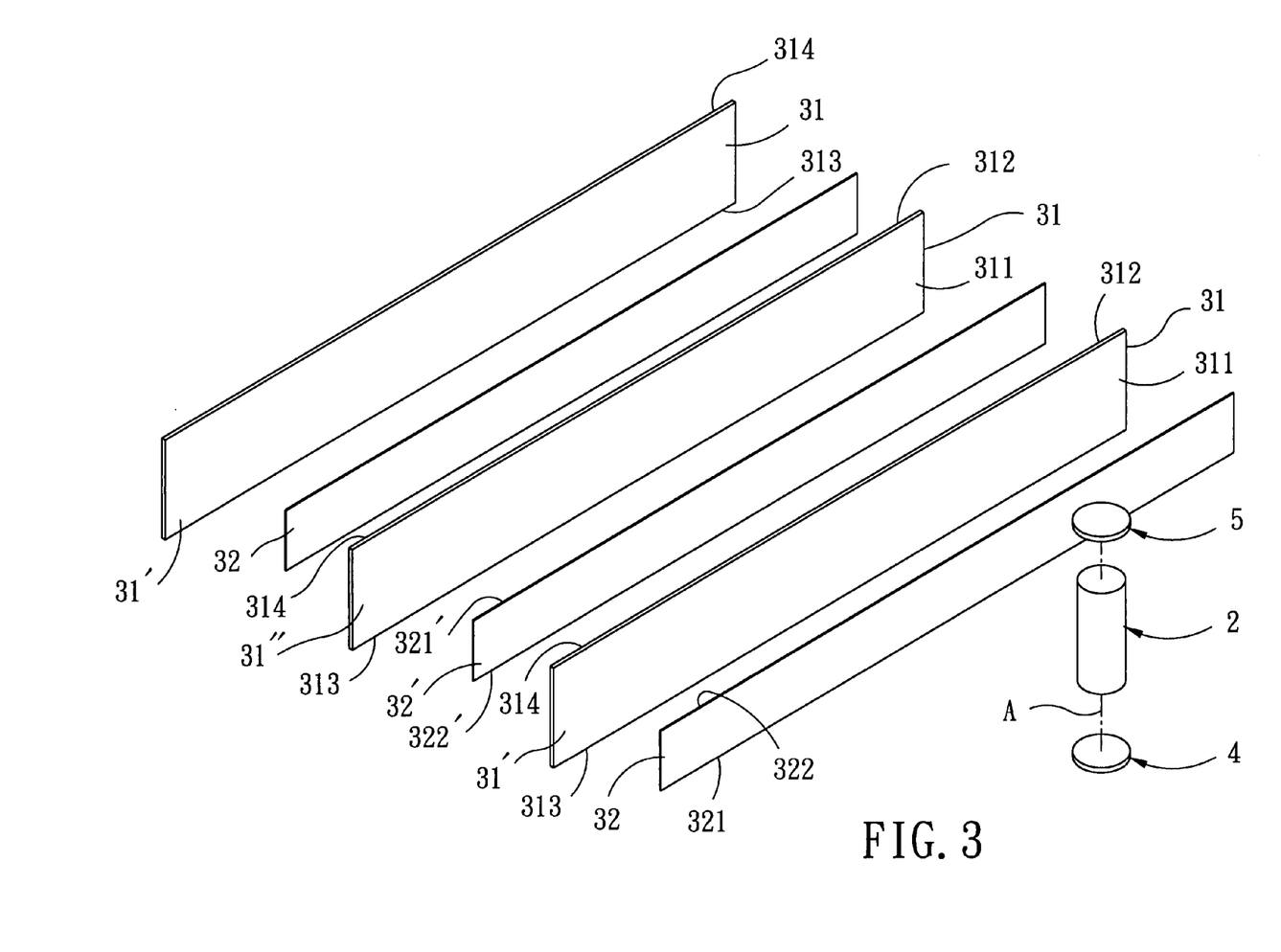
FIG. 3 is an exploded perspective view of the first preferred embodiment of the multi-layer piezoelectric component according to this invention.
Figure 4:
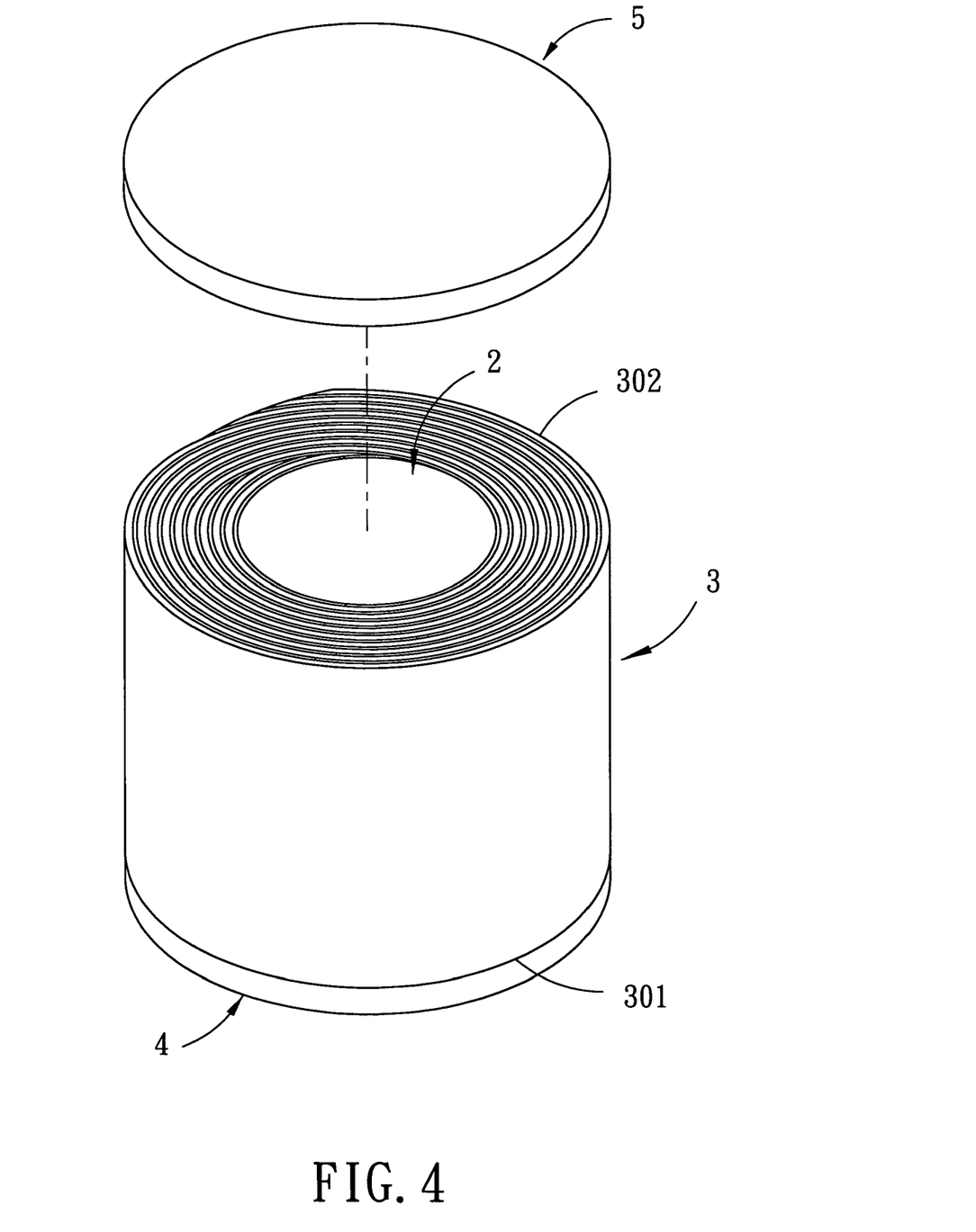
FIG. 4 is a fragmentary exploded perspective view of the first preferred embodiment.

Referring to FIGS. 1 and 2, a conventional laminar piezoelectric component 1 is shown to include a plurality of piezoelectric ceramic sheets 11, a plurality of first inner electrode sheets 12, a plurality of second inner electrode sheets 12', a first outer electrode sheet 13, and a second outer electrode sheet 14. The first and second inner electrode sheets 12,12' are alternately sandwiched between two adjacent ones of the piezoelectric ceramic sheets 11. The first outer electrode sheet 13 is overlaid on an uppermost one of the piezoelectric ceramic sheets 11, and is electrically connected to the first inner electrode sheets 12. The second outer electrode sheet 14 is underlaid beneath a lowermost one of the piezoelectric ceramic sheets 11, and is electrically connected to the second inner electrode sheets 12'.

The laminar piezoelectric component 1 can be used in applications, such as a high voltage electric source for a television set, an ozone generator, and the like. Currently, the laminar piezoelectric component 1 is also applicable to an electric source for a backlight module of a portable component. As compared to a conventional electromagnetic transformer, the conventional laminar piezoelectric component 1 has advantages, such as low power consumption, high transforming efficiency, low current leakage, reduced size, ease of integration with other components, etc. However, in order to assure the electrical connection of the outer electrode sheets 13,14 to the inner electrode sheets 12,12' in the aforesaid manner, a complicated laminating process is required, which in turn increases the manufacturing difficulty. Therefore, it is desired to reduce cost by minimizing the volume of the laminar piezoelectric component, and by simplifying the manufacturing process thereof.

SUMMARY OF THE INVENTION

Therefore, the object of the present invention is to provide a multi-layer piezoelectric component which has a laminar roll formed by winding a plurality of piezoelectric layers so as to simplify the manufacturing process and to reduce the manufacturing cost.

A multi-layer piezoelectric component according to this invention includes a plurality of piezoelectric layers, a first inner electrode sheet, a second inner electrode sheet, a first outer electrode, and a second outer electrode. The piezoelectric layers are wound around an axis to form a laminar roll having first and second end faces transverse to the axis. The piezoelectric layers include at least one first layer and at least one second layer. Each of the first and second layers has opposite first and second edges respectively at the first and second end faces, and opposite inner and outer circumferential surfaces. The first and second inner electrode sheets respectively overlie the inner circumferential surfaces of the first and second layers. The first and second outer electrodes are respectively and electrically connected to the first and second inner electrode sheets.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Referring to FIGS. 3, 4, 5, and 6, the first preferred embodiment of the multi-layer piezoelectric component according to this invention is shown to include a central post 2 that extends along an axis (A), three piezoelectric layers 31, two first inner electrode sheets 32, a second inner electrode sheet 32', a first outer electrode 4, and a second outer electrode 5. The piezoelectric layers 31 are wound around the central post 2 to form a laminar roll 3 having first and second end faces 301,302 transverse to the axis (A). The piezoelectric layers 31 include two first layers 31' and one second layer 31". The first and second layers 31',31" are disposed to alternate with each other. Each of the first and second layers 31',31" has opposite first and second edges 313,314 respectively at the first and second end faces 301,302, and opposite inner and outer circumferential surfaces 311,312. The first and second inner electrode sheets 32,32' respectively overlie the inner circumferential surfaces 311 of the first and second layers 31',31". The first and second outer electrodes 4,5 are respectively and electrically connected to the first and second inner electrode sheets 32,32'.

Figure 5:
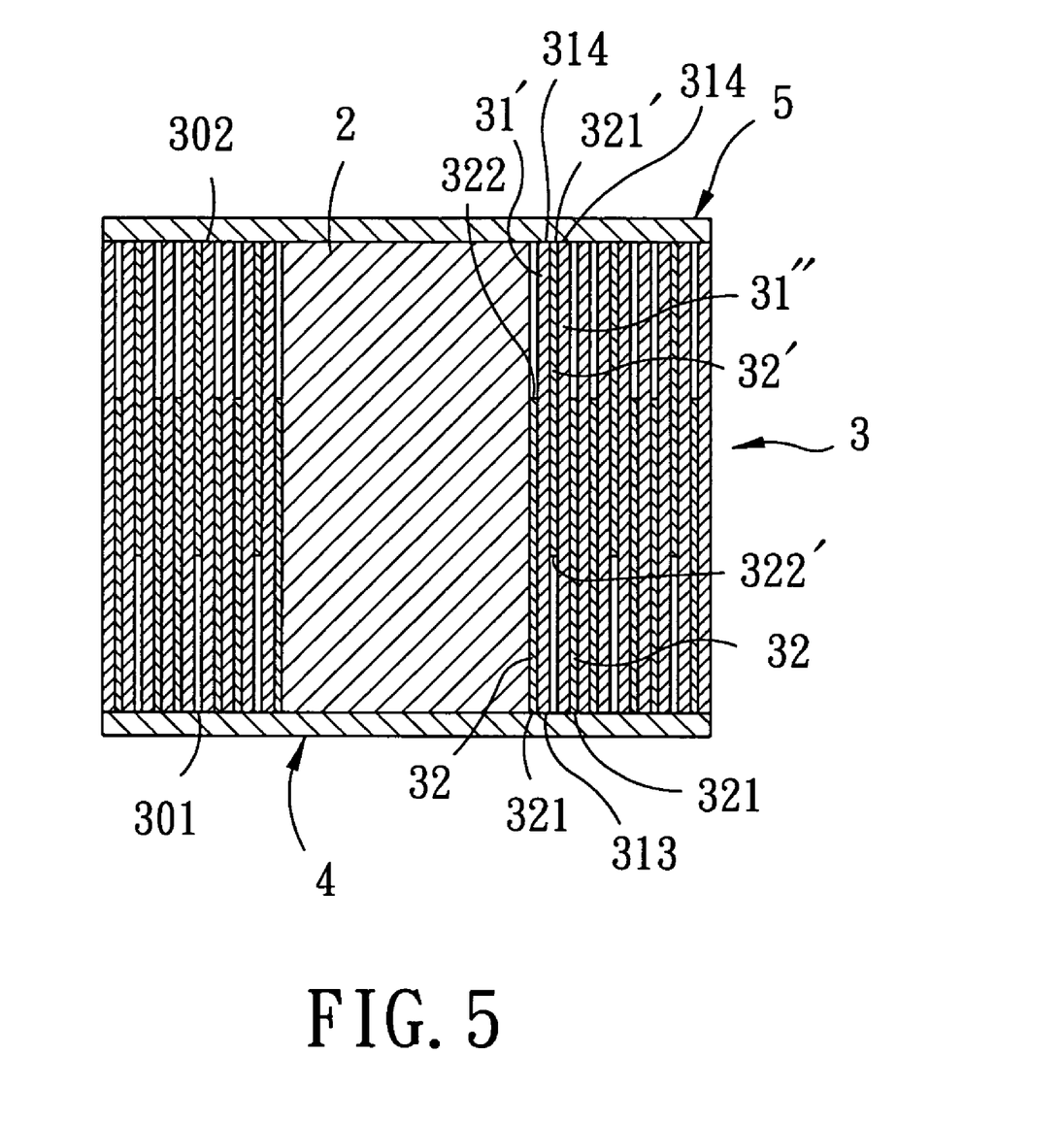
FIG. 5 is a sectional view of the first preferred embodiment.
Figure 6:
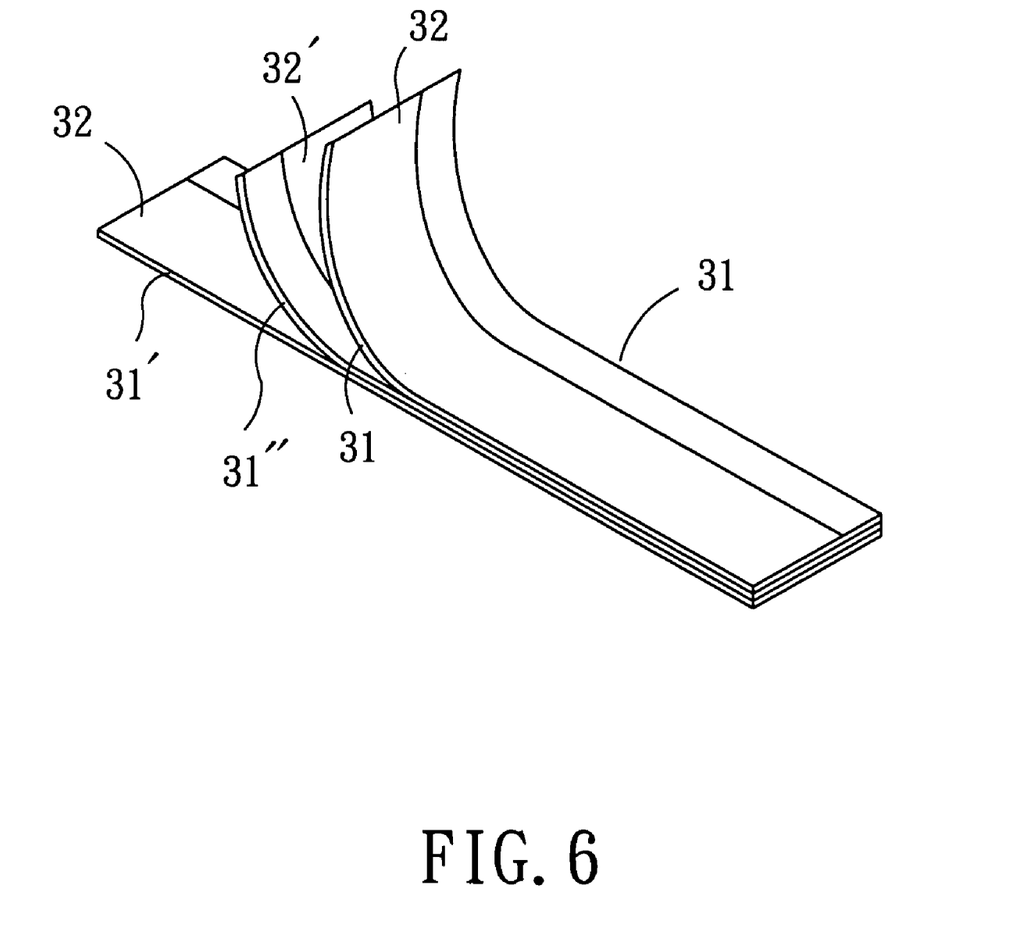
FIG. 6 is a perspective view showing the arrangement relationship among piezoelectric layers and inner electrode sheets of the first preferred embodiment.

Specifically referring to FIG. 5, the first inner electrode sheet 32 has a first end 321 flush with the first edge 313 of the first layer 31', and a second end 322 which is opposite to the first end 321 and which is spaced apart from the second edge 314 of the first layer 31'. The first outer electrode 4 is mounted on the first end face 301 of the laminar roll 3 and is in contact with the first end 321 of the first inner electrode sheet 32. The second inner electrode sheet 32' has a third end 321' flush with the second edge 314 of the second layer 31", and a fourth end 322' which is opposite to the third end 321' and which is spaced apart from the first edge 313 of the second layer 31". The second outer electrode 5 is mounted on the second end face 302 of the laminar roll 3 and is in contact with the third end 321' of the second inner electrode sheet 32'.

While the laminar roll 3 is shown to have a circular cross section in the preferred embodiment, the laminar roll 3 can also be formed to have a cross section with other suitable shapes, such as a polygon.

Figure 7:
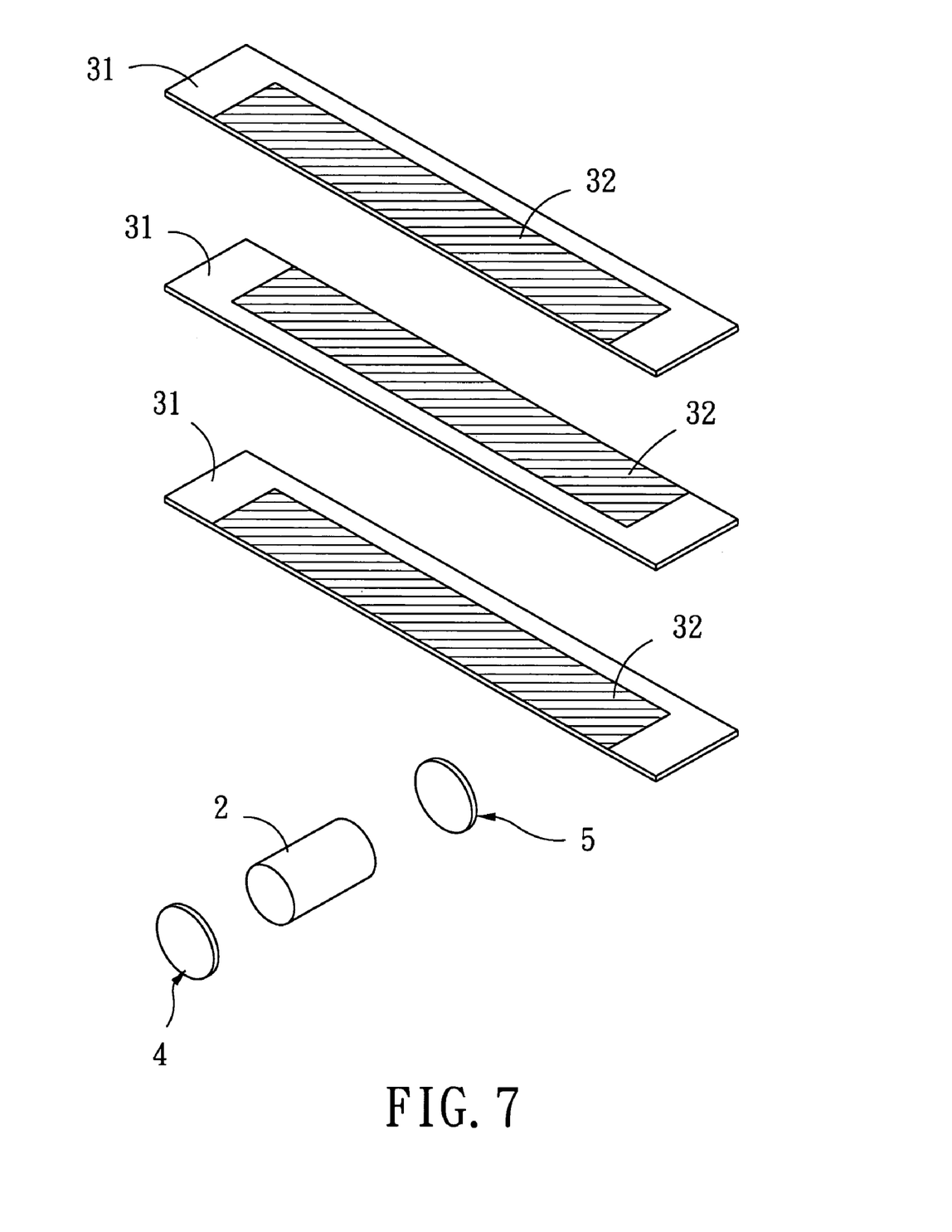
FIG. 7 is an exploded perspective view of the second preferred embodiment of the multi-layer piezoelectric component according to this invention.
Figure 8:
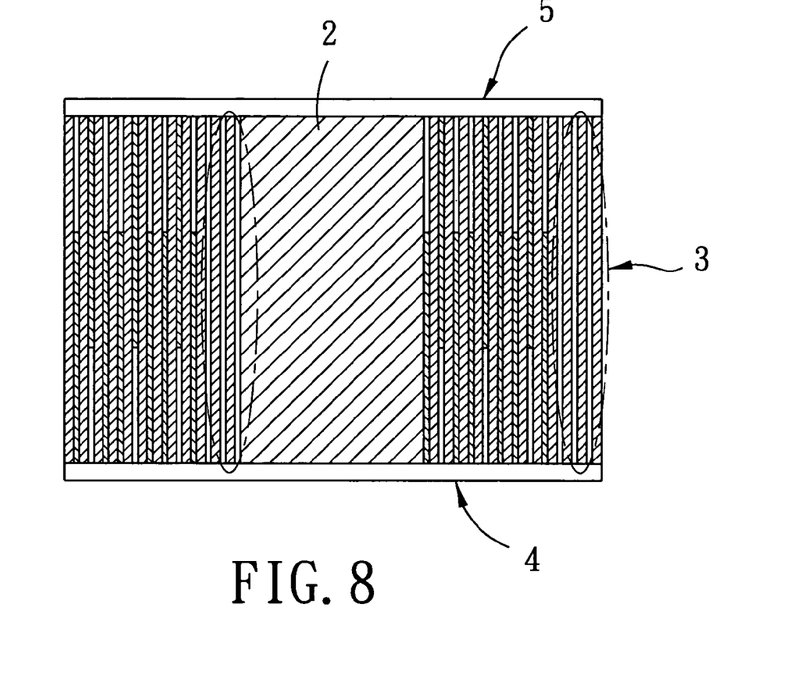
FIG. 8 is a sectional view of the second preferred embodiment.

Referring to FIGS. 7 and 8, the second preferred embodiment of this invention is shown to be substantially similar to the first preferred embodiment except that the length of each inner electrode sheet 32 is not identical to that of the adjacent piezoelectric layer 31. Therefore, the areas (indicated by the dotted oval lines in FIG. 8) of the laminar roll 3 proximate to and distal from the central post 2, respectively, are devoid of the inner electrode sheets 32.

Figure 9:
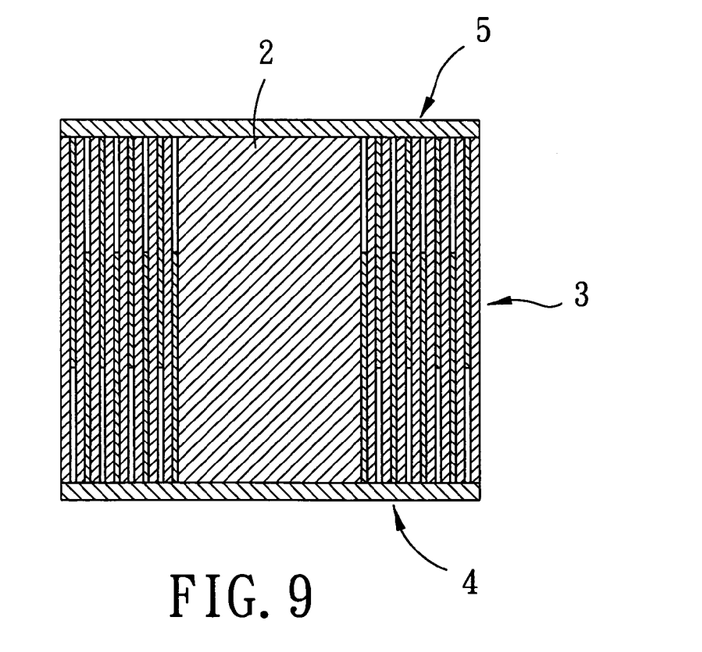
FIG. 9 is a sectional view of the third preferred embodiment of the multi-layer piezoelectric component according to this invention.

Referring to FIG. 9, the third preferred embodiment of this invention is shown to be substantially similar to the first preferred embodiment except that the laminar roll 3 is composed of two piezoelectric layers and two inner electrode sheets laminated alternately to each other.

Figure 10:
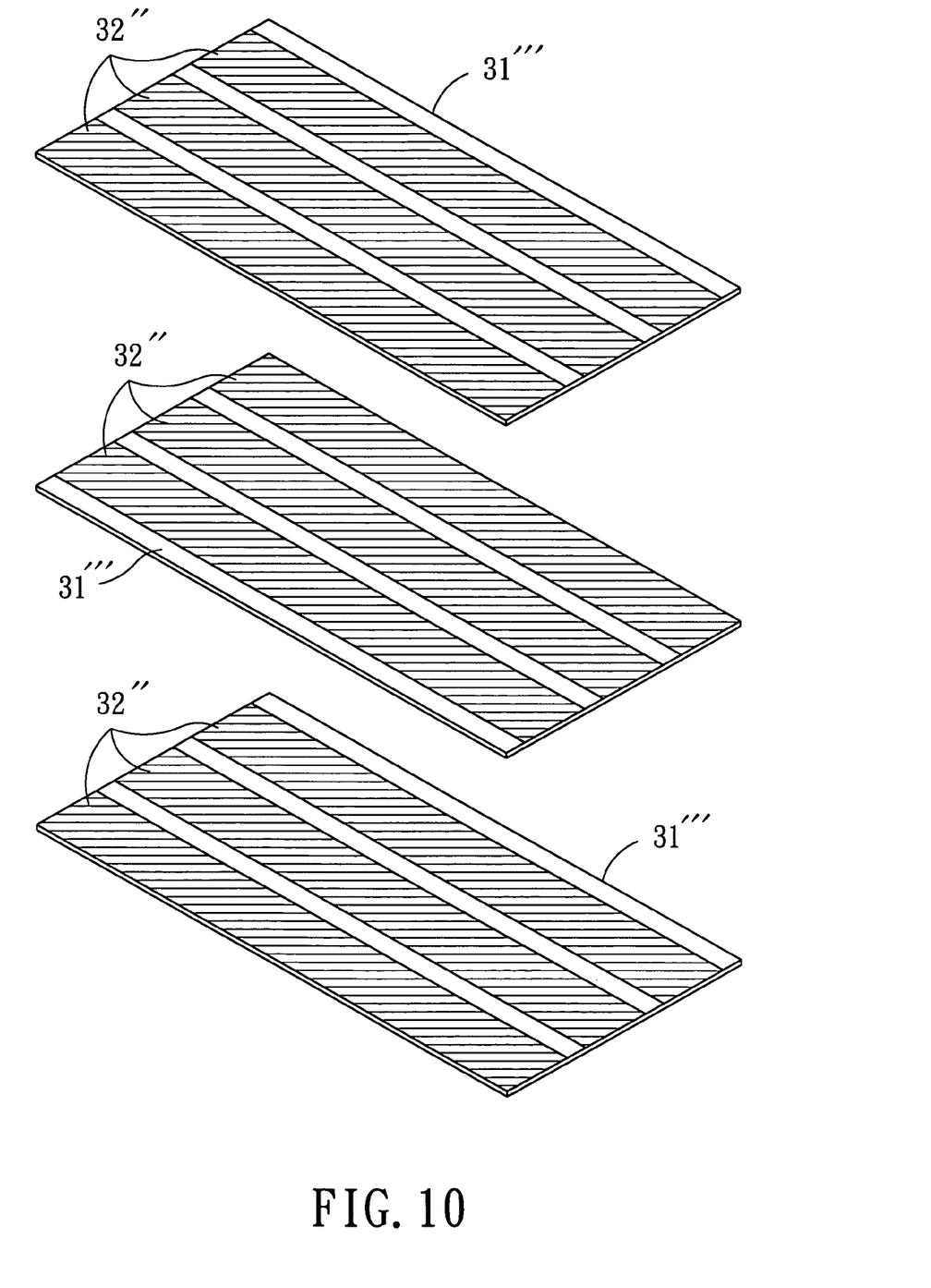
FIGS. 10, 11, and 12 illustrate consecutive steps for producing the first preferred embodiment of the multi-layer piezoelectric component according to this invention.
Figure 11:
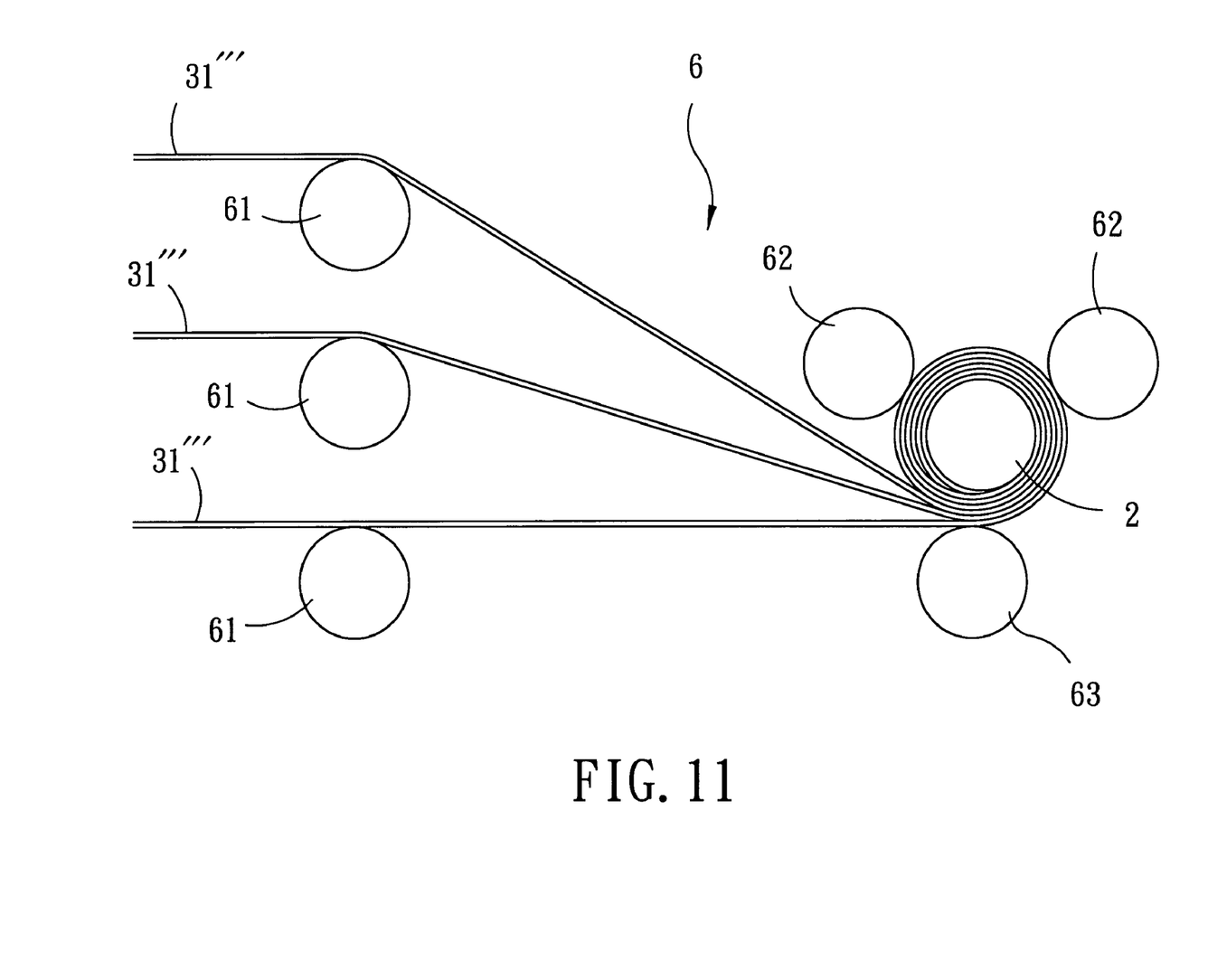
Figure 12:
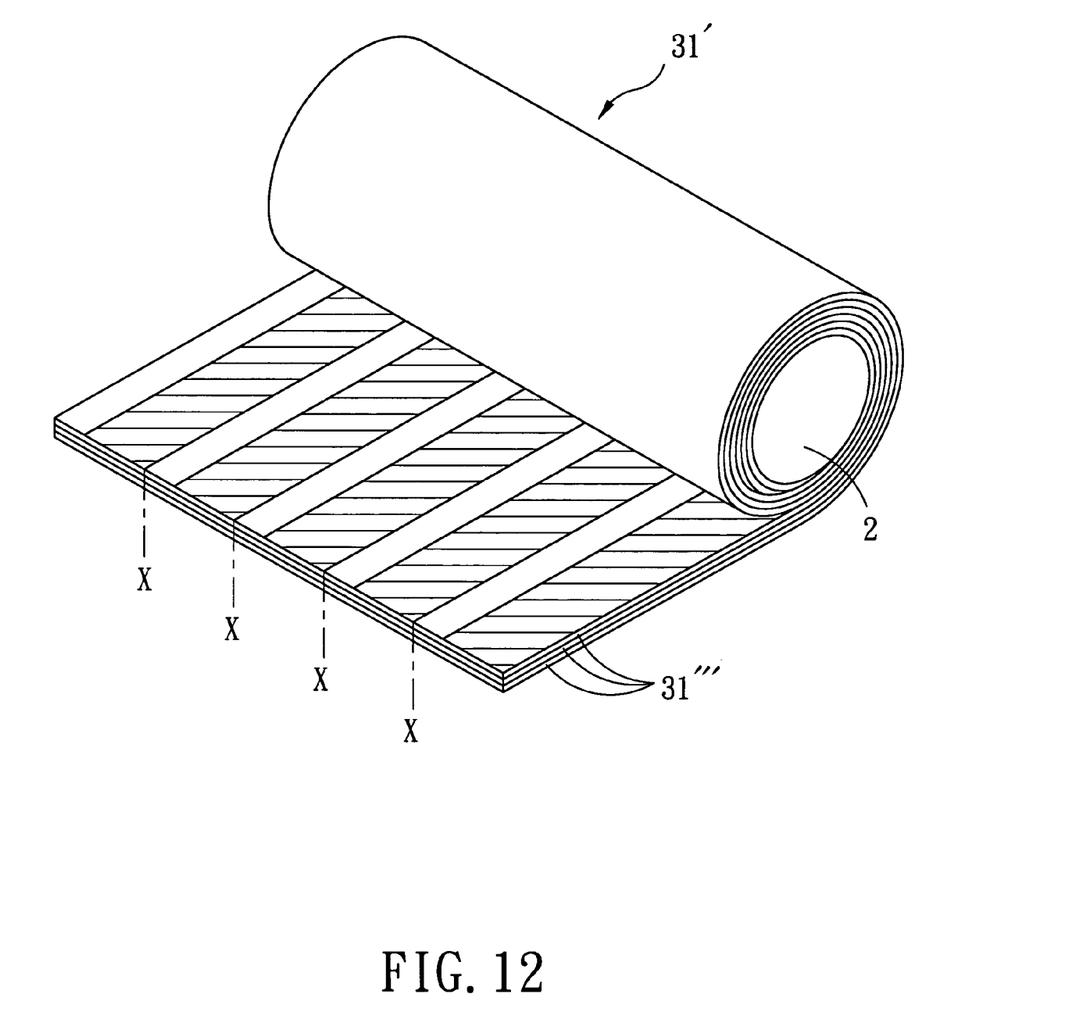

Referring to FIGS. 10, 11, and 12, during the manufacture of the multi-layer piezoelectric component of this invention, a plurality of ceramic sheets 31''' made of a material, such as lead-zirconate-titanate, barium titanate and the like, are initially prepared. A plurality of inner electrode sheets 32" are then printed on the ceramic sheets 31'''. The inner electrode sheets 32" are made of conductive metal, such as nickel, copper, zinc, and mixtures thereof.

The ceramic sheets 31''' printed with the inner electrode sheets 32" are wound subsequently around the central post 2 using a winding apparatus 6. The central post 2 is preferably made of a material such as lead-zirconate-titanate, barium titanate and the like. The winding apparatus 6 includes three tension bars 61, two rollers 62, and one press axle 63. The tension bars 61 permit extension of the ceramic sheets 31''' in a tensed state. The press axle 63 prevents loosening of the ceramic sheets 31''' after being wound around the central post 2.

After winding the ceramic sheets 31''' to result in a wound body 3', the wound body 3' is cut along cutting lines (X) to obtain a plurality of green ceramic rolls, which are then sintered at elevated temperatures to obtain the laminar rolls 3.

Finally, the first and second outer electrodes 4,5 are mounted on the first and second end faces 301,302 of each of the laminar rolls 3 to complete the multi-layer piezoelectric component. Preferably, the first and second outer electrodes 4,5 are independently made of a material such as nickel, copper, zinc, and mixtures thereof.

Figure 13:
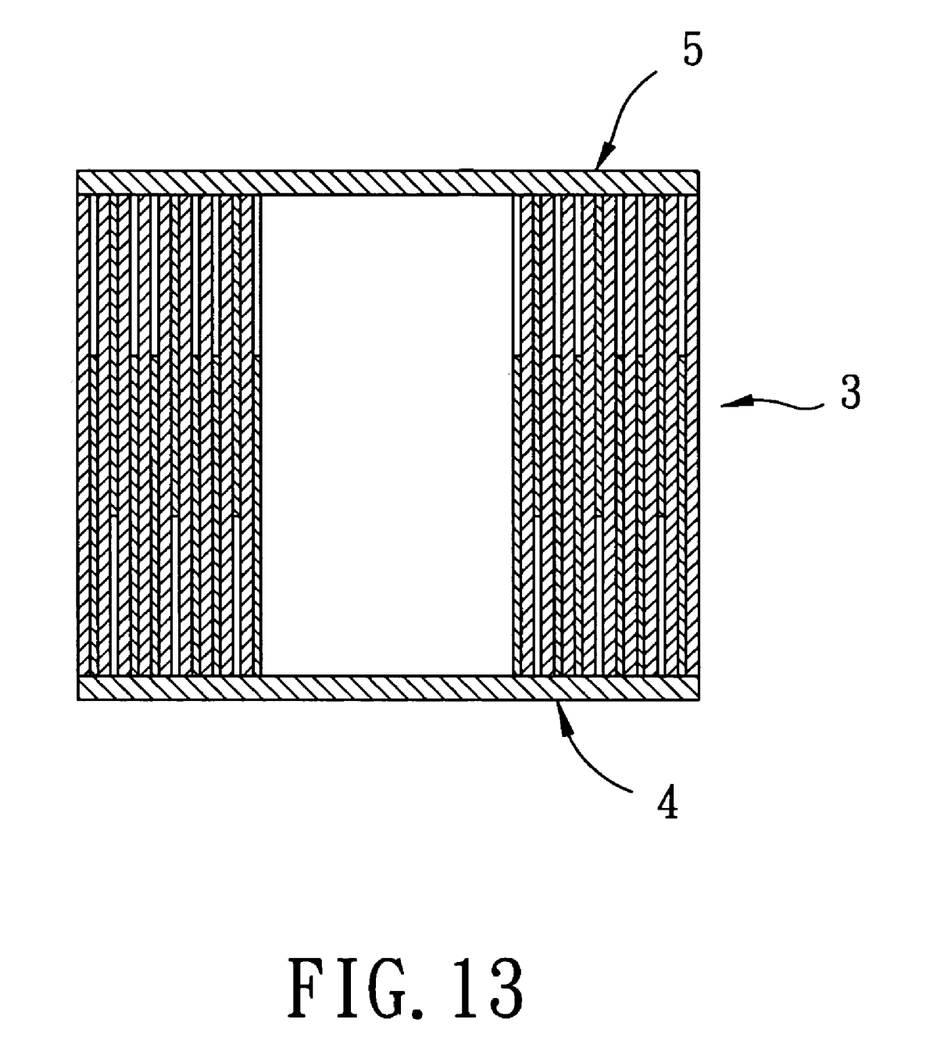
FIG. 13 is a sectional view of the fourth preferred embodiment of the multi-layer piezoelectric component according to this invention.

Referring to FIG. 13, the fourth preferred embodiment of this invention is shown to be substantially similar to the first preferred embodiment except that the central post 2 for winding the ceramic sheets 31''' is made of a material that is capable of vaporizing at elevated temperatures. Therefore, the central post 2 is vaporized during sintering so as to form the laminar roll 3 with a hollow center.

Figure 14:
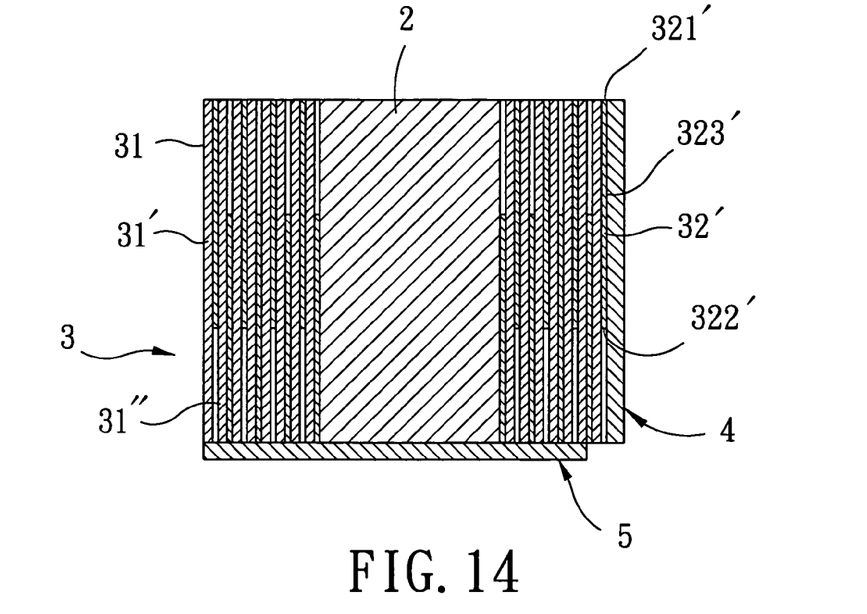
FIG. 14 is a sectional view of the fifth preferred embodiment of the multi-layer piezoelectric component according to this invention.

Referring to FIG. 14, the fifth preferred embodiment of this invention is shown to be substantially similar to the first preferred embodiment, except for the following. The piezoelectric layers 31 include one first layer 31' and one second layer 31". The second inner electrode sheet 31' has a fifth end 323' which extends axially and which interconnects the third and fourth ends 321',322' of the second inner electrode sheet 31'. The fifth end 323' of the second inner electrode sheet 31' is exposed from the outer circumferential surface 312 of the second layer 31". The first outer electrode 4 is disposed over the outer circumferential surface 312 of the second layer 31" and is in contact with the fifth end 323' of the second inner electrode sheet 32'.

Figure 15:
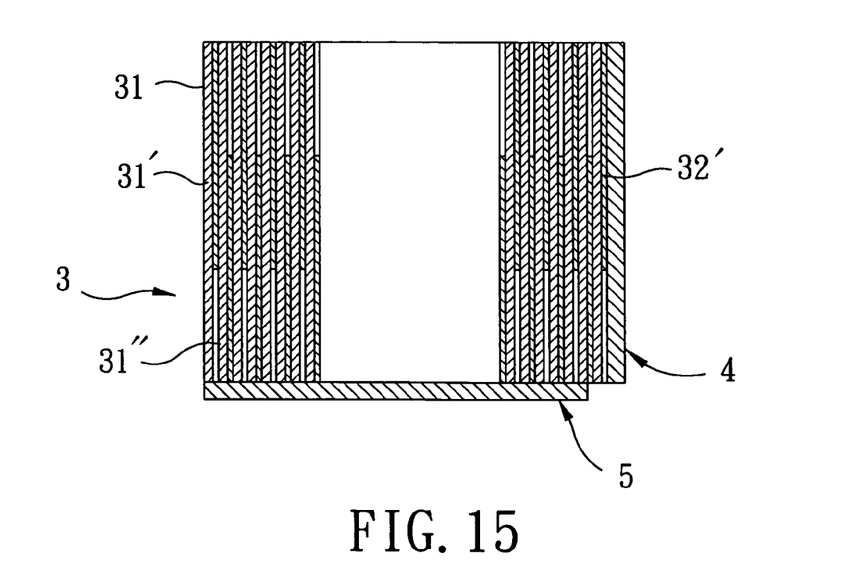
FIG. 15 is a sectional view of the sixth preferred embodiment of the multi-layer piezoelectric component according to this invention.

Referring to FIG. 15, the sixth preferred embodiment of this invention is shown to be similar to the fifth preferred embodiment except that the central post 2 is made of a material capable of vaporizing at elevated temperatures. Therefore, the central post 2 is vaporized during sintering so as to form the laminar roll 3 with a hollow center.

In view of the aforesaid, the multi-layer piezoelectric component according to this invention increases the electrode area therein, and enhances the output efficiency as well in view of the laminar roll therein. The overall size of the multi-layer piezoelectric component of this invention is also reduced as compared to that of the prior art. Furthermore, in order to permit winding around the central post 2, the piezoelectric layers 31 are relatively thin. Therefore, the multi-layer piezoelectric component according to this invention can achieve an output efficiency identical or substantially identical to that of the prior art by using a relatively low current. Additionally, the multi-layer piezoelectric component of this invention can be produced through a relatively simple process.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A multi-layer piezoelectric component, comprising:

a plurality of piezoelectric layers which are wound around an axis to form a laminar roll having first and second end faces transverse to said axis, said piezoelectric layers including at least one first layer and at least one second layer, each of said first and second layers having opposite first and second edges respectively at said first and second end faces, and opposite inner and outer circumferential surfaces;

a first inner electrode sheet and a second inner electrode sheet respectively overlying said inner circumferential surfaces of said first and second layers; and first and second outer electrodes respectively and electrically connected to said first and second inner electrode sheets, wherein said first inner electrode sheet has a first end flush with said first edge of said first layer and a second end which is opposite to said first end, said first outer electrode being mounted on said first end face of said laminar roll and being in contact with said first end of said first inner electrode sheet.

2. The multi-layer piezoelectric component as claimed in claim 1, wherein said second end of said first inner electrode sheet is spaced apart from said second edge of said first layer, said second inner electrode sheet having a third end flush with said second edge of said second layer, and a fourth end which is opposite to said third end and which is spaced apart from said first edge of said second layer, said second outer electrode being mounted on said second end face of said laminar roll and being in contact with said third end of said second inner electrode sheet.

3. The multi-layer piezoelectric component as claimed in claim 2, wherein the number of said piezoelectric layer is more than two, said first and second layers being disposed to alternate with each other.

4. The multi-layer piezoelectric component as claimed in claim 1, wherein said piezoelectric layers are made of barium titanate.

5. The multi-layer piezoelectric component as claimed in claim 1, wherein said piezoelectric layers are made of lead-zirconate-titanate.

6. The multi-layer piezoelectric component as claimed in claim 1, wherein said first and second inner electrode sheets are made of a material selected from the group consisting of nickel, copper, and zinc.

7. The multi-layer piezoelectric component as claimed in claim 1, wherein said first and second outer electrode sheets are independently made of a material selected from the group consisting of nickel, copper, and zinc.

8. The multi-layer piezoelectric component as claimed in claim 1, wherein said laminar roll has a cross section with a shape selected from the group consisting of a circle and a polygon.

9. The multi-layer piezoelectric component as claimed in claim 1, wherein said second inner electrode sheet has a third end flush with said second edge of said second layer, and a fourth end which is opposite to said third end and which is spaced apart from said first edge of said second layer, said second inner electrode sheet further having a fifth end which extends axially and which interconnects said third and fourth ends, said fifth end being exposed from said outer circumferential surface of said second layer, said first outer electrode being disposed over said outer circumferential surface of said second layer and being in contact with said fifth end of said second inner electrode sheet.

10. The multi-layer piezoelectric component as claimed in claim 9, wherein said piezoelectric layers include one said first layer and one said second layer.

11. A multi-layer piezoelectric component, comprising:
a plurality of piezoelectric layers which are wound around an axis to form a laminar roll having first and second end faces transverse to said axis, said piezoelectric layers including at least one first layer and at least one second layer, each of said first and second layers having opposite first and second edges respectively at said first and second end faces, and opposite inner and outer circumferential surfaces;
a first inner electrode sheet and a second inner electrode sheet respectively overlying said inner circumferential surfaces of said first and second layers;
first and second outer electrodes respectively and electrically connected to said first and second inner electrode sheets; and
a central post that extends along said axis, said laminar roll being wound around said central post,
wherein said central post is made of a material selected from a group consisting of lead-zirconate-titanate and barium titanate.

12. A multi-layer piezoelectric component, comprising:
a plurality of piezoelectric layers which are wound around an axis to form a laminar roll having first and second end faces transverse to said axis, said piezoelectric layers including at least one first layer and at least one second layer, each of said first and second layers having opposite first and second edges respectively at said first and second end faces, and opposite inner and outer circumferential surfaces;
a first inner electrode sheet and a second inner electrode sheet respectively overlying said inner circumferential surfaces of said first and second layers;
first and second outer electrodes respectively and electrically connected to said first and second inner electrode sheets; and
a central post that extends along said axis, said laminar roll being wound around said central post,
wherein said central post is made of a material capable of vaporizing at elevated temperatures.

* * * * *